(12) United States Patent
Lao et al.

(10) Patent No.: US 8,159,052 B2
(45) Date of Patent: Apr. 17, 2012

(54) APPARATUS AND METHOD FOR A CHIP ASSEMBLY INCLUDING A FREQUENCY EXTENDING DEVICE

(75) Inventors: Binneg Y. Lao, Rancho Palos Verdes, CA (US); William W. Chen, Westchester, CA (US)

(73) Assignee: Semtech Corporation, Camarillo, CA (US)

( * ) Notice: Subject to any disclaimer, the term of this patent is extended or adjusted under 35 U.S.C. 154(b) by 753 days.

(21) Appl. No.: 12/166,173

(22) Filed: Jul. 1, 2008

(65) Prior Publication Data

US 2009/0256266 A1    Oct. 15, 2009

Related U.S. Application Data

(60) Provisional application No. 61/043,999, filed on Apr. 10, 2008.

(51) Int. Cl.
*H01L 23/52* (2006.01)
*H01L 21/00* (2006.01)

(52) U.S. Cl. . 257/666; 257/671; 257/691; 257/E23.031; 257/E23.141; 257/E23.153; 438/111; 438/123

(58) Field of Classification Search ............ 257/666, 257/671, 691, E23.031, E23.141, E23.153; 438/111, 123
See application file for complete search history.

(56) References Cited

U.S. PATENT DOCUMENTS

| | | | | |
|---|---|---|---|---|
| 4,754,317 A | * | 6/1988 | Comstock et al. | 257/672 |
| 4,920,074 A | * | 4/1990 | Shimizu et al. | 29/827 |
| 4,975,761 A | * | 12/1990 | Chu | 257/686 |
| 5,138,430 A | * | 8/1992 | Gow et al. | 257/712 |
| 5,196,992 A | * | 3/1993 | Sawaya | 361/736 |
| 5,214,845 A | * | 6/1993 | King et al. | 29/841 |
| 5,304,844 A | * | 4/1994 | Horiuchi et al. | 257/676 |

(Continued)

FOREIGN PATENT DOCUMENTS

WO    WO 96/41377    12/1996

OTHER PUBLICATIONS

JEDEC Design Standard, Design Requirements for Outlines of Solid State and Related Products, JEDEC Publication 95, May 2007, pp. 4.19-1/D through 4.19-16/D, 11.2-765(s), Issue D, JEDEC Solid State Technology Association.

*Primary Examiner* — Eugene Lee
*Assistant Examiner* — Peniel M Gumedzoe
(74) *Attorney, Agent, or Firm* — McDermott Will & Emery LLP

(57) ABSTRACT

A chip assembly includes a chip, a paddle, an interface layer, a frequency extending device, and lands. The chip has contacts. The interface layer is disposed between the chip and the paddle. The frequency extending device has at least a conductive layer and a dielectric layer. The conductive layer has conductive traces. The frequency extending device is disposed adjacent to the side of the chip and overlying the paddle. The lands are disposed adjacent to the side of the paddle. The contacts are connected to the conductive traces. The conductive traces are connected to the lands. The frequency extending device is configured to reduce impedance discontinuity such that the impedance discontinuity produced by the frequency extending device is less than an impedance discontinuity that would be produced by bond wires each having a length greater than or substantially equal to the distance between the contacts and the lands.

27 Claims, 11 Drawing Sheets

U.S. PATENT DOCUMENTS

| | | | |
|---|---|---|---|
| 5,332,864 A * | 7/1994 | Liang et al. | 174/523 |
| 5,365,409 A * | 11/1994 | Kwon et al. | 361/813 |
| 5,386,141 A * | 1/1995 | Liang et al. | 257/676 |
| 5,442,231 A * | 8/1995 | Miyamoto et al. | 257/668 |
| 5,559,316 A * | 9/1996 | Tomoda | 257/666 |
| 5,854,511 A * | 12/1998 | Shin et al. | 257/713 |
| 6,002,165 A * | 12/1999 | Kinsman | 257/666 |
| 6,072,211 A | 6/2000 | Miller et al. | |
| 6,340,839 B1 * | 1/2002 | Hirasawa et al. | 257/672 |
| 2004/0183165 A1 * | 9/2004 | Abbott et al. | 257/646 |

* cited by examiner

1110: PROVIDING A PLURALITY OF METAL LEAD FRAMES FORMED IN A FIXED-ATTACHED ARRAY

1120: ATTACHING A PLURALITY OF CHIPS TO THE PLURALITY OF METAL LEAD FRAMES

1130: ATTACHING A PLURALITY OF FREQUENCY EXTENDING DEVICES TO THE PLURALITY OF METAL LEAD FRAMES

1140: ENCAPSULATING THE CHIP ASSEMBLIES

1150: SEPARATING THE CHIP ASSEMBLIES FROM THE FIXED-ATTACHED ARRAY INTO INDIVIDUAL PACKAGES

FIG. 11

APPARATUS AND METHOD FOR A CHIP ASSEMBLY INCLUDING A FREQUENCY EXTENDING DEVICE

CROSS-REFERENCES TO RELATED APPLICATIONS

The present application claims the benefit of priority under 35 U.S.C. §119 from U.S. Provisional Patent Application Ser. No. 61/043,999, entitled "Apparatus and Method for a Chip Assembly Including a Frequency Extending Device," filed on Apr. 10, 2008, which is hereby incorporated by reference in its entirety for all purposes.

BACKGROUND

1. Field

The subject technology relates generally to electronic packaging, and more specifically to methods and apparatus for a chip assembly including a frequency extending device.

2. Background

In optical/electronic and wired/wireless communications, it is increasingly common to communicate using signals with frequencies well into the ranges of a few GHz or tens of GHz. For example, for OC-192/STM-64 optical transmission, the frequency range may be 5 GHz to 15 GHz. For OC-768/STM-256 optical transmission, the frequency range may be, for instance, from 20 GHz to 60 GHz. For the third-generation cellular technology, the frequency range of interest may be between 1.885 GHz and 2.2 GHz or around 5 GHz with the 802.11 standard. As a result, integrated circuits (ICs) suited for these high-speed applications are more in demand now than before.

Before these high-speed ICs can be placed onto a printed wiring board (PWB) or printed circuit board (PCB), they need to be packaged either as a single chip package, a multi chip package, a stacked chip package, or a combination thereof (e.g., a hybrid package or a module). In addition to providing ease of handling and installation, the primary function of a package is one of dimensional transformation. While at the chip level, the input/output (I/O) pad size and spacing are in the order of approximately 3 to 5 mils, the same dimensions at the PWB level are typically 10 to 40 mils. At frequencies below 1 GHz, fanning out using bond wires can generally accomplish this objective. As the operating frequency of the chip approaches 5 GHz or higher, the task of dimensional transformation needs to be accomplished while maintaining the microwave characteristic impedance, typically 50 ohms, of the overall transmission pathway from the chip to the PWB. The bond wires with their inductance and high reactance at these higher frequencies present themselves as discontinuities in a 50 ohm environment, resulting in degraded signal fidelity.

SUMMARY

In one aspect of the disclosure, a chip assembly comprises a chip, a conductive paddle, a conductive interface layer, a frequency extending device, and a plurality of conductive lands. The chip has a front surface, a rear surface, and a side. The chip has conductive contacts on the front surface. The conductive paddle is coupled to the chip and has a front surface, a rear surface, and a side. The conductive interface layer is disposed between the rear surface of the chip and the front surface of the conductive paddle. The conductive interface layer is coupled to the rear surface of the chip and coupled to the front surface of the conductive paddle.

The frequency extending device has at least a first conductive layer and a first dielectric layer. The first conductive layer has one or more conductive traces. The frequency extending device is disposed at least partially adjacent to the side of the chip and disposed at least partially overlying the conductive paddle. The conductive interface layer is disposed between the frequency extending device and the conductive paddle.

The plurality of conductive lands is disposed at least partially adjacent to the side of the conductive paddle. At least one of the conductive contacts is connected to at least one of the one or more conductive traces. The at least one of the one or more conductive traces is connected to at least one of the plurality of conductive lands.

The frequency extending device is configured to reduce impedance discontinuity such that the impedance discontinuity produced by the frequency extending device is less than an impedance discontinuity that would be produced by one or more bond wires each having a length substantially equal to a distance between one of the conductive contacts of the chip and a corresponding one of the plurality of conductive lands.

In a further aspect of the disclosure, a chip assembly comprises a chip, a substrate, an interface layer, a frequency extending device, and a plurality of conductive lands. The chip has a front surface, a rear surface, and a side. The chip has conductive contacts. The substrate is coupled to the chip and has a front surface, a rear surface, and a side. The interface layer is disposed between the rear surface of the chip and the front surface of the substrate. The frequency extending device has at least a first conductive layer and a first dielectric layer. The first conductive layer has one or more conductive traces. The frequency extending device is disposed at least partially adjacent to the side of the chip and disposed at least partially overlying the substrate.

At least one of the conductive contacts of the chip is connected to one of the one or more conductive traces of the frequency extending device. The at least one of the one or more conductive traces of the frequency extending device is connected to one of the plurality of conductive lands. The frequency extending device is configured to reduce impedance discontinuity such that the impedance discontinuity produced by the frequency extending device is less than an impedance discontinuity that would be produced by one or more bond wires if such one or more bond wires were to be used in place of the frequency extending device.

In yet a further aspect of the disclosure, a method of manufacturing chip assemblies comprises providing a plurality of metal lead frames formed in a fixed-attached array. Each of the plurality of metal lead frames has a paddle in a center region and a plurality of conductive lands in a peripheral region. The plurality of conductive lands surround the paddle, and the plurality of conductive lands are discretely defined and arranged inwardly toward the paddle.

The method further comprises attaching a plurality of chips to the plurality of metal lead frames and attaching a plurality of frequency extending devices to the plurality of metal lead frames.

The step of attaching a plurality of chips to the plurality of metal lead frames comprises attaching each of the plurality of chips to a corresponding one of the paddles. Each of the plurality of chips has a front surface, a rear surface, and a side. Each of the plurality of chips overlies the corresponding one of the paddles. Each of the plurality of chips has conductive contacts on its front surface.

The step of attaching a plurality of frequency extending devices to the plurality of metal lead frames comprises disposing each of the plurality of frequency extending devices at least partially adjacent to the side of a corresponding one of the plurality of chips and at least partially overlying a corresponding one of the paddles. Each of the plurality of frequency extending devices has at least a first conductive layer and a first dielectric layer. The first conductive layer has one or more conductive traces. Each of the plurality of frequency extending devices is configured to provide a lower impedance discontinuity as compared to one or more bond wires.

The method further comprises connecting at least one of the conductive contacts of each of the plurality of chips to at least one of the one or more conductive traces of a corresponding one of the plurality of frequency extending devices. The method further comprises connecting at least one of the one or more conductive traces of each of the plurality of frequency extending devices to at least one of the plurality of conductive lands of a corresponding one of the plurality of metal lead frames.

The method further comprises encapsulating the chip assemblies. Each of the chip assemblies has a corresponding one of the plurality of metal lead frames, a corresponding one of the plurality of chips, and a corresponding one of the plurality of frequency extending devices. The method further comprises separating the chip assemblies from the fixed-attached array into individual packages.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

BRIEF DESCRIPTION OF THE DRAWINGS

FIG. 11 illustrates an exemplary method of manufacturing chip assemblies.

DETAILED DESCRIPTION

Figure 1:
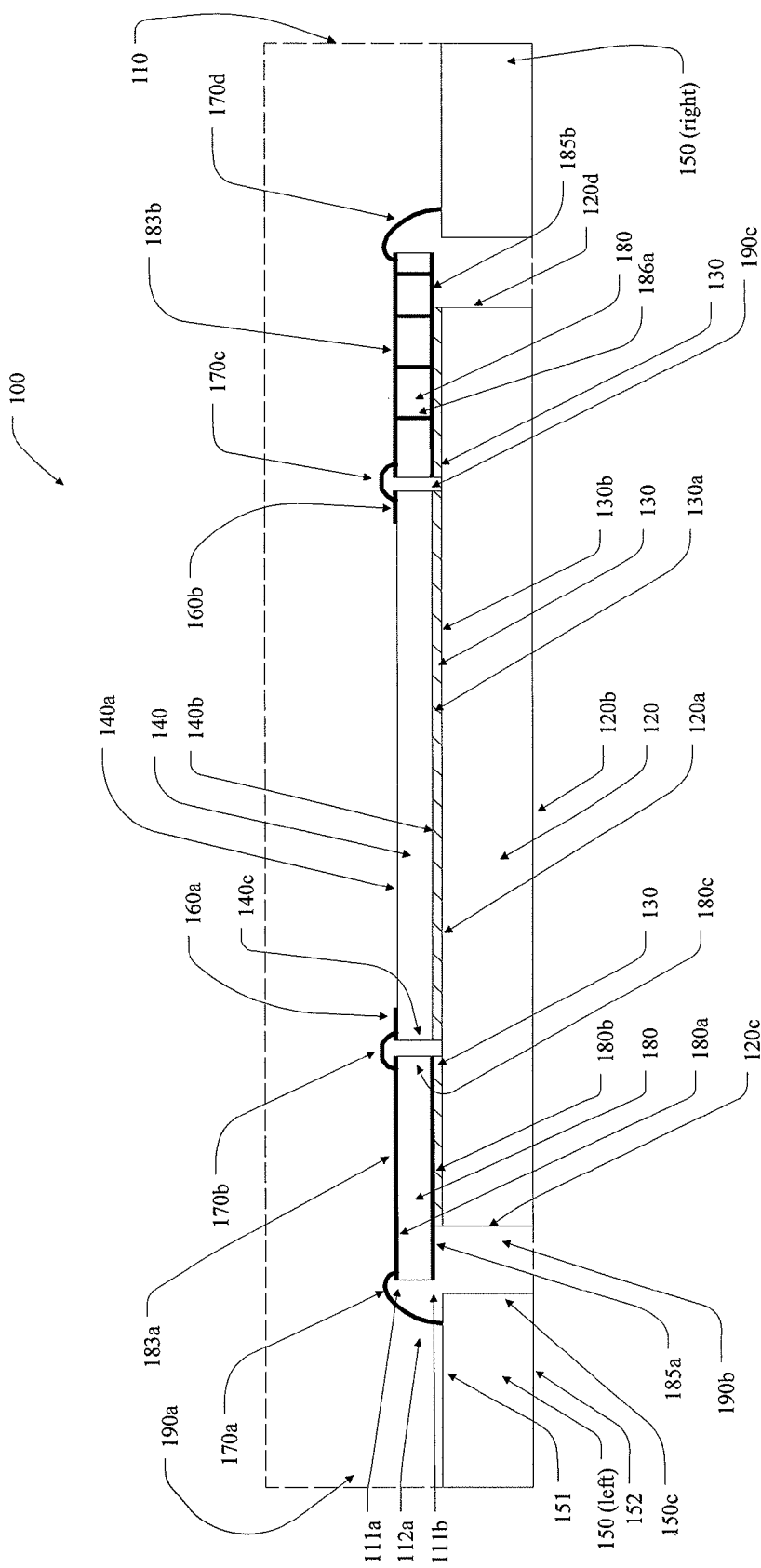
FIG. 1 is a diagrammatic cross-sectional view depicting an exemplary chip assembly.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be apparent to those skilled in the art that the subject technology may be practiced without these specific details. In some instances, well-known structures and components are shown in block diagram form in order to avoid obscuring the concepts of the subject technology.

Some of the reference numbers used in the figures are similar, and the items identified by such similar reference numbers may have similar properties at least according to some aspects of the disclosure. Such items may have different properties according to other aspects of the disclosure. For example, according to some aspects of the disclosure, the items identified by reference numbers 100, 120, 130, 140, 150, and 180 shown in FIGS. 1 and 2 may be similar to (i) the items identified by reference numbers 400, 420, 430, 440, 450, and 480 shown in FIGS. 4 and 5, respectively, (ii) the items identified by reference numbers 600, 620, 630, 640, 650, and 680 shown in FIG. 6, respectively, (iii) the items identified by reference numbers 700, 720, 730, 740, 750, and 780 shown in FIGS. 7 and 8, respectively, and (iv) the items identified by reference numbers 900, 920, 930, 940, 950, and 980 shown in FIG. 9, respectively. According to other aspects of the disclosure, these items may have different properties.

Figure 2:
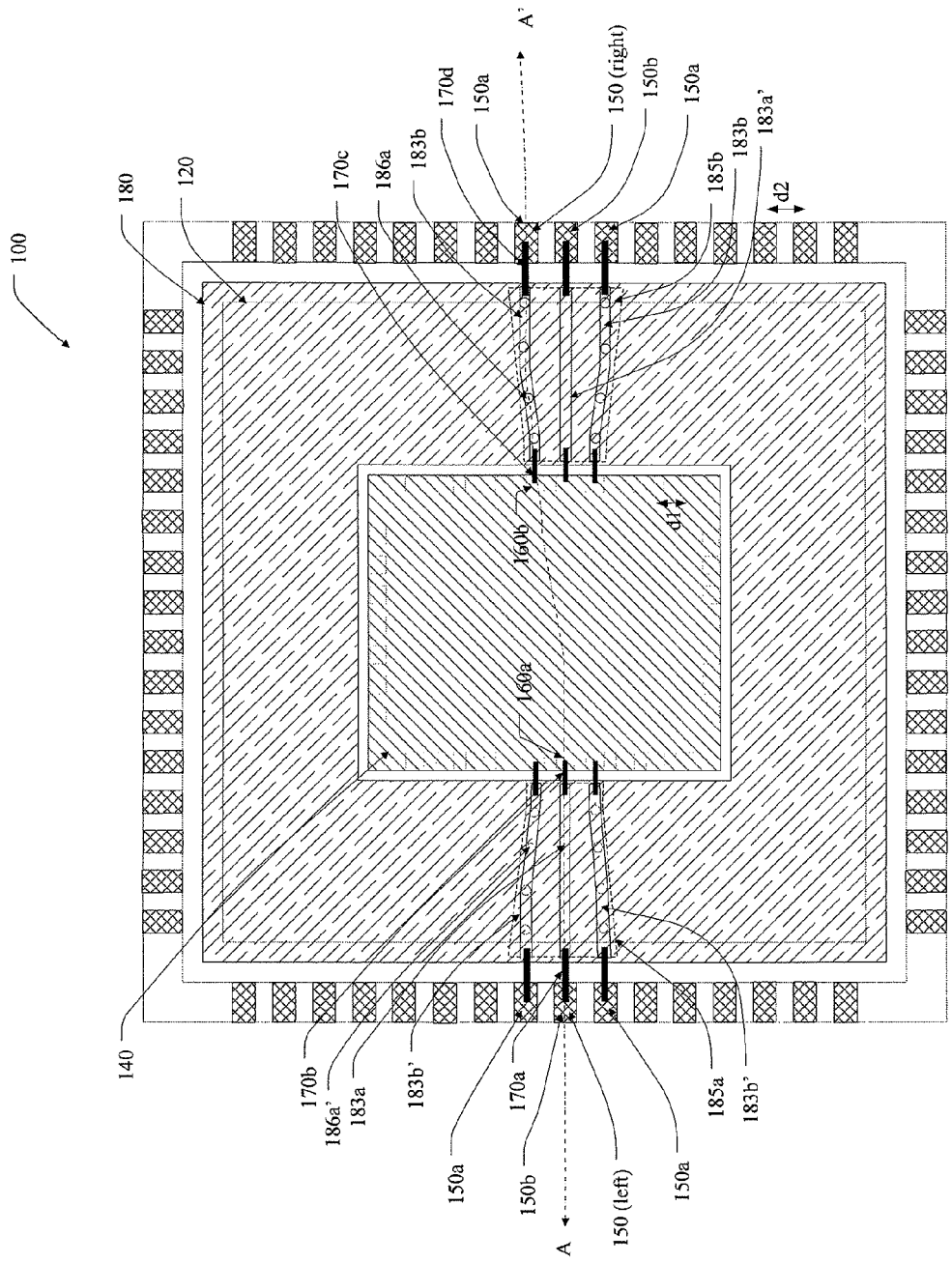
FIG. 2 is a diagrammatic top plan view depicting the exemplary chip assembly illustrated in FIG. 1.

FIG. 1 is a diagrammatic cross-sectional view depicting an exemplary chip assembly. FIG. 2 is a diagrammatic top plan view depicting the exemplary chip assembly. FIG. 1 is a cross-sectional view along A-A' of FIG. 2. Referring to FIGS. 1 and 2, a microelectronic chip assembly 100 includes a chip 140 and a frequency extending device 180. The microelectronic chip assembly 100 may further include an interface layer 130 and a lead frame. The lead frame may include a paddle 120 disposed in the center region of the lead frame and lands 150 disposed in the peripheral region of the lead frame surrounding the paddle 120. The lands 150 may be discretely defined and arranged inwardly toward the paddle 120. A microelectronic chip assembly or a chip assembly as described herein may be, for example, an integrated circuit package used in surface mounted electronic circuit designs or other types of packages.

A chip 140 may have a front surface 140*a*, a rear surface 140*b*, and a side 140*c*. A chip 140 may further have conductive contacts (e.g. 160*a* and 160*b*) on the front surface 140*a*. A chip as described herein may be an integrated circuit, a die, a semiconductor chip, an electronic device, an optoelectronic device, a component, an element, or a combination thereof.

A frequency extending device 180 may have a front surface 180*a*, a rear surface 180*b*, and a side 180*c*. A frequency extending device 180 may include one or more conductive layers such as conductive layers 111*a* and 111*b* (e.g., metal layers). A first conductive layer 111*a* (e.g., a top conductive layer) may include one or more conductive traces such as conductive traces 183*a*, 183*b*, 183*a*', and 183*b*'. A second conductive layer 111*b* (e.g., a bottom conductive layer) may include one or more conductive traces such as conductive traces 185*a* and 185*b*.

Each of the first and second conductive layers 111*a* and 111*b* may include one or more high frequency signal lines, one or more low frequency signal lines, and/or one or more ground traces. The conductive traces 183*a* and 183*a*' may be high frequency signal lines, and the conductive traces 183*b* and 183*b*' may be ground traces that are connected to the blocks of ground traces 185*a* and 185*b* using vias (e.g., 186*a* and 186*a*'). The conductive trace 183*a* may be disposed laterally between the ground traces 183*b*'. The conductive trace 183*a*' may be disposed laterally between the ground traces 183*b*.

The frequency extending device 180 may further include one or more dielectric layers or non-conductive layers (e.g., a dielectric layer 112*a*). The non-conductive portion of the frequency extending device 180 (e.g., the dielectric layer 112*a*) may be made of ceramic, glass, an organic plastic material, another dielectric material, or any other suitable non-conductive material. The number of dielectric layers may increase as the number of signal interconnect routing (e.g., input/output interconnect routing) increases.

The frequency extending device 180 may further include one or more conductive vias (e.g., 186*a* and 186*a*') that connect one or more conductive traces on one conductive layer to one or more conductive traces on another conductive layer.

The frequency extending device 180 may be disposed generally between the chip 140 and the lands 150. The frequency extending device 180 may be disposed at least partially adjacent to a side of the chip 140 and may surround some or all sides of the chip 140. The frequency extending device 180 may be laterally spaced by a gap 190*c* from the chip 140. It is also disposed partially or entirely overlying the paddle 120. The frequency extending device 180 may extend laterally beyond the edge 120*d* of the paddle 120.

The frequency extending device 180 may be in an annular shape and surround all sides of the chip 140. Alternately, the frequency extending device 180 may surround only a portion of the chip 140. For example, it can be disposed adjacent to only one or some of the sides of the chip 140 (e.g., the side(s) where the high frequency signal conductive contacts are located). The frequency extending device 180 may consist of one piece or several pieces. A one-piece frequency extending device may be in an annular shape or another shape. A multiple-piece frequency extending device may be assembled into an annular shape or another shape. A frequency extending device may be a single, integral unit. A frequency extending device may partially or completely encapsulate a chip, by surrounding partially or completely the front surface and the sides of a chip, as described below with reference to FIGS. 6, 7, and 9.

Referring to FIGS. 1 and 2, the thickness of the frequency extending device 180 may be about the same as the thickness of the chip 140. Alternatively, the thickness of the frequency extending device 180 can be different from (e.g., smaller or larger than) the thickness of the chip 140.

The interface layer 130 may have a front surface 130*a* and a rear surface 130*b*. The interface layer 130 may be a conductive interface layer (e.g., solder or conductive epoxy). The paddle 120 may have a front surface 120*a*, a rear surface 120*b*, and a side 120*c*. The paddle 120 may be a conductive paddle such as a metal paddle. A paddle may be a substrate or a carrier. It can be a generic, standard, commercially available, non-customized, inexpensive, off-the-self unit. The interface layer 130 may be disposed between the rear surface 140*b* of the chip 140 and the front surface 120*a* of the paddle 120. The front surface 130*a* of the interface layer 130 may be in contact with the rear surface 140*b* of the chip 140. The rear surface 130*b* of the interface layer 130 may be in contact with the front surface 120*a* of the paddle 120. The interface layer 130 may be used to attach the chip 140 to the paddle 120. The chip 140 may be generally disposed in the center of the paddle 120. The interface layer 130 may also be disposed between the frequency extending device 180 and the paddle 120 and be used to attach the frequency extending device 180 to the paddle 120.

Each of the lands 150 may have a front surface 151, a rear surface 152, and a side 150*c*. In one aspect, the lands 150 may be conductive metal leads, which do not extend beyond the boundary 110 (shown with a dashed line) of the microelectronic chip assembly 100. In another aspect, the lands 150 may be conductive pads. The lands 150 may be made of one or more layers. Conductive portions of the lands 150 may be on one or more such layers. The lands 150 may be disposed laterally adjacent to a side of the paddle 120 and laterally spaced by a bottom gap 190*b* from the paddle 120. The lands 150 may be an array generally surrounding some or all sides of the paddle 120. The lands 150 may surround the sides of the frequency extending device 180. The lands 150 may be discretely defined and arranged inwardly toward the paddle 120 (as shown, for example, in FIG. 2).

According to one aspect, the paddle 120 and lands 150 may be made of the same material and may be of the same thickness. In one aspect, the paddle 120 may be conductive and may be made of one or more layers. In another aspect, the paddle 120 may be non-conductive or may include a combination of conductive and non-conductive portions. The chip 140 and the frequency extending device 180 may be surface mounted on the paddle 120 using the interface layer 130. Each of the chip 140 and the interface layer 130 may, completely or partially, overlie the paddle 120. In one aspect, the paddle 120 may be larger than the chip 140.

Still referring to FIGS. 1 and 2, bond wires (e.g., 170*b* and 170*c*) may connect the conductive contacts (e.g., 160*a* and 160*b*) on the chip 140 to the conductive traces (e.g., 183*a* and 183*b*) on the frequency extending device 180. Bond wires 170*a* and 170*d* may connect the conductive traces 183*a* and 183*b* to their respective front surfaces 151 of the lands 150. The interface layer 130 may connect the conductive traces 185*a* and 185*b* to the front surface 120*a* of the paddle 120. The microelectronic chip assembly 100 may be potted with non-conductive, resilient materials such as plastic (e.g., epoxy type material), which fills the top and bottom gaps 190*a* and 190*b* within the boundary 110 of the assembly 100. The boundary 110 (the dashed line) is the boundary of the plastic encapsulation of a singulated package. According to one aspect, the components within the assembly 100 are substantially not movable with respect to one another because of the encapsulation.

In one aspect, the chip 140, the interface layer 130, the paddle 120, the frequency extending device 180, and the lands 150 may be planar and parallel to one another. In another aspect, the front and rear surfaces of the chip 140, the interface layer 130, the paddle 120, the frequency extending device 180, and the lands 150 may be planar and parallel to one another. The conductive layers (e.g., 111*a* and 111*b*), the dielectric layers (e.g., 112*a*), and the conductive traces may also be planar and parallel to one another and parallel to the chip 140, the paddle 120, and the frequency extending device 180. A conductive layer may overlie a dielectric layer and may be in direct contact with the dielectric layer. The paddle 120 and the lands may be vertically on the same plane. The chip 140 and the frequency extending device 180 may also be vertically on the same plane.

A conductive trace 183*a* may be a high frequency signal line. Thus, a conductive contact 160*a*, bond wires 170*b* and 170*a*, a conductive trace 183*a*, and a land 150 (left) may form a high frequency signal path used for a high frequency signal. Conductive traces 183*b* and 185*b* may be used for ground (GND). Thus, a conductive contact 160*b*, bond wires 170*c* and 170*d*, conductive traces 183*b*, 185*a* and 185*b*, vias 186*a*, the interface layer 130 (or at least a portion of the interface layer 130 that is under the frequency extending device 180), the paddle 120, and lands 150 (right) may be used for ground. The conductive trace 185a may be connected to the paddle 120 using the interface layer 130. The rear surface 140b of the chip 140 may be connected to the paddle 120 using the interface layer 130. The rear surface 140b, the conductive trace 185a, the interface layer 130, and the paddle 120 may be utilized for ground.

Referring to FIG. 2, the lands 150a may be used for ground, and a land 150b may be used for a high frequency signal. Each of the conductive traces 185a and 185b may be a block of a ground trace, whose width adjacent to the lands 150 is larger than its width adjacent to the chip 140. Each of the conductive traces 185a and 185b may have a trapezoidal shape.

Figure 3:
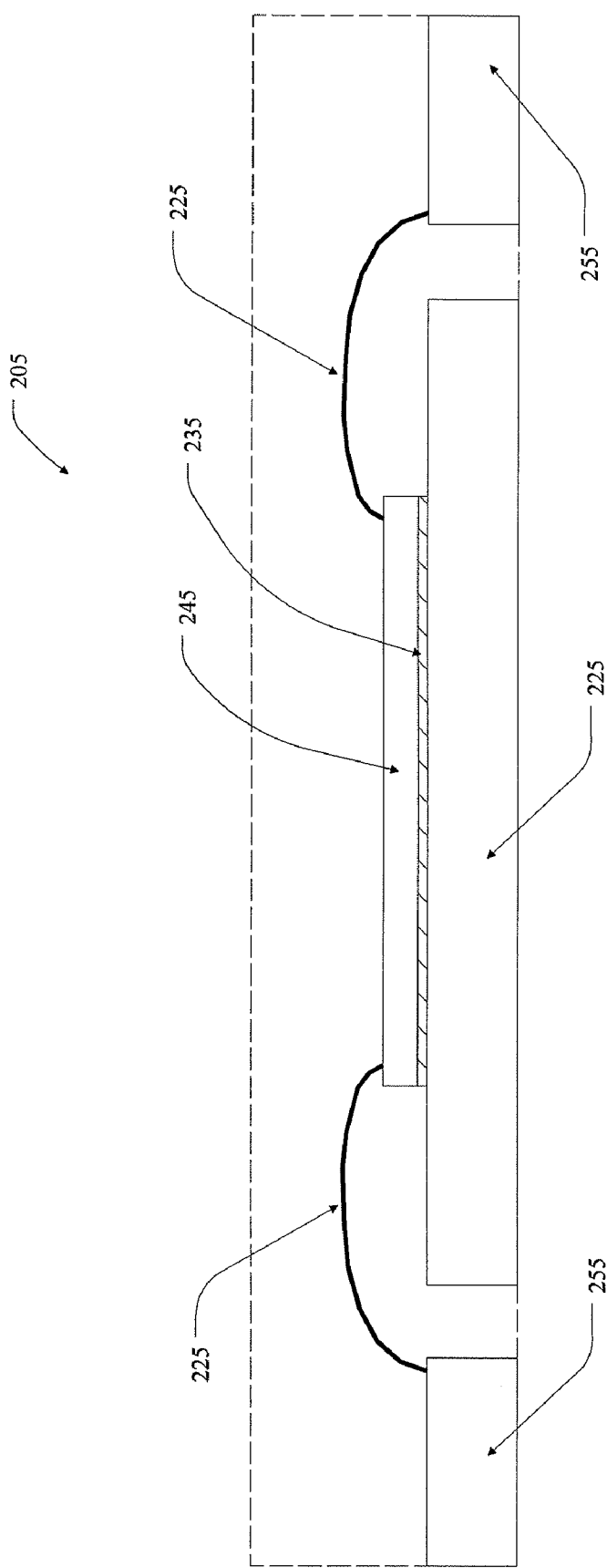
FIG. 3 is a diagrammatic cross-sectional view depicting an exemplary assembly.

FIG. 3 is a diagrammatic cross-sectional view depicting an exemplary assembly. An assembly 205 includes a die 245 attached to a substrate 225 using a die attach 235. The die 245 is connected to leads 255 using bond wires 225. The assembly 205 may be referred to as a quad flat package no leads (QFN) package. This package is similar to a quad flat package (QFP), but the leads do not extend beyond the edge of the package.

Given the size of the package, the size of the die and the low cost of assembly, the assembly 205 may be suited for use in low frequency wireless applications where the effects of typical bond-wire length have a minimal effect. With minimized bond-wire length, the operating frequency of a plastic-molded package such as the assembly 205 may be somewhat improved.

For high frequency operation, a package such as the assembly 205, however, faces a number of limitations. Some of these are listed below:

A mismatch in die and package dimensions can result in long bond-wire lengths. The resulting high inductance can limit the operating frequency bandwidth to low GHz range.

Even with the shortest bond-wire length, the operating frequency can still be limited due to impedance discontinuities, for example, in bond wire 225 and leads 255. For example, if the bond-wire length is greater than 1/50 of the signal wavelength, the resulting reactance can be greater than 20 ohms.

Now referring back to FIGS. 1 and 2, the microelectronic chip assembly 100 can increase the operating frequency bandwidth (e.g., up to 60-70 GHz) by utilizing the frequency extending device 180, which may be located in the space between the chip 140 and the lands 150.

The frequency extending device 180 can be in the shape of a ring surrounding the entire chip 140, or it can be only on the side(s) where the high frequency signal contacts (or pads) are located. If the frequency extending device 180 is in the shape of a ring, it does not need to be one piece but may consist of several pieces whose overall assembled shape is a ring. It can be a substrate with different thicknesses, but the preferred thickness is substantially the same thickness as the chip 140. A frequency extending device has at least one dielectric layer. In one configuration, it may have a top metal layer for signal lines and a bottom layer for ground. It can have more than one dielectric layers for high input/output (I/O) interconnect routing.

In FIGS. 1 and 2, the conductive contacts (or pads) on the chip 140 and the corresponding lands 150 are both wire-bonded to the frequency extending device 180. A signal trace(s) or signal line(s), which can be a microstrip (e.g., a signal trace 483a in FIGS. 4 and 5) or a coplanar line (e.g., the conductive trace 183a in FIGS. 1 and 2), may complete the connection from a conductive contact 160a (or a signal pad) on the chip 140 to the land 150. In the case of a radio frequency (RF) signal pad, a signal line can be made with its characteristic impedance, e.g., 50 ohms. Conductive traces (e.g., 183b, 186a, 185b, 185a) can be used for ground (GND). The ground associated with a microstrip or coplanar line can be disposed on the bottom metal layer (e.g., 185a, 185b) and/or on the top metal layer (e.g., 183b and 183b'). The conductive traces 183b and 185b may be connected together with vias (e.g., 186a) as shown and wire-bonded to the corresponding conductive contacts on the chip 140 and the lands 150.

A frequency extending device provides many advantages. For example:

A frequency extending device can serve as a spatial transformer from the chip contact pitch of, for example, 125 μm to the land pitch of, for example, 500 μm. The chip contact pitch may be the distance between two adjacent contacts (or pads) on the front surface of the chip 140. The land pitch may be the distance between two adjacent lands (e.g., 150). In FIG. 2, an exemplary chip contact pitch is shown as d1, and an exemplary land pitch is shown as d2.

A frequency extending device can minimize the bond-wire lengths and the inductance associated with the bond wires for higher frequency applications. It can provide a lower discontinuity in impedance than that provided by the configuration shown in FIG. 3, which uses long bond wires. Thus, the impedance discontinuity associated with a frequency extending device is lower than the impedance discontinuity associated with one or more bond wires, if such bond wires were used in place of the frequency extending device. A frequency extending device can be configured to reduce impedance discontinuity such that the impedance discontinuity produced by the frequency extending device is less than an impedance discontinuity that would be produced by one or more bond wires (e.g., bond wires 225 in FIG. 3) each having a length greater than, equal to, or substantially equal to the distance between a contact of a chip and a corresponding land.

A frequency extending device can provide a platform for placing matching elements to cancel out residual impedance discontinuity and for placing discrete components such as power line by-pass capacitors and phase lock loop (PLL) low pass filters closer to the chip.

Still referring to FIGS. 1 and 2, the signal traces on a frequency extending device 180 may start on the chip side with a pitch of, for example, around 125 μm or 3 to 5 mils, which may match a typical pitch of the contacts (or pads) on a chip 140. The signal traces may then fan out toward the lands 150 and end with a pitch of, for example, 500 μm or 10 to 40 mils, which may match the pitch of the lands 150. With a frequency extending device as a spatial transformer, all the bond wires (e.g., 170a, 170b, 170c, 170d) may now be made short and parallel to their neighboring bond wires. If the frequency extending device is not used, then the large inductance associated with long bond wires can limit the usable bandwidth of a microelectronic chip assembly. It may be possible to increase the chip size to shorten the bond wires. However, the cost increase due to the chip size increase (for example, at $0.25/mm²) is more than the cost of a frequency extending device.

The use of a frequency extending device may replace a long bond wire with two short bond wires (e.g., 170b and 170a) and a controlled-impedance transmission line (e.g., 183a). A bond wire 170b may be disposed between a conductive contact 160a of the chip 140 and a conductive trace 183a (a transmission line), and a bond wire 170a may be disposed between the conductive trace 183a (a transmission line) and the land 150 (left). In this exemplary configuration, the operating bandwidth may be typically in the order of 10 GHz or less. The bond wires and the lands in the assembly may still appear as microwave discontinuities which reflect waves appreciably (>−10 dB) at higher frequencies.

Figure 5:
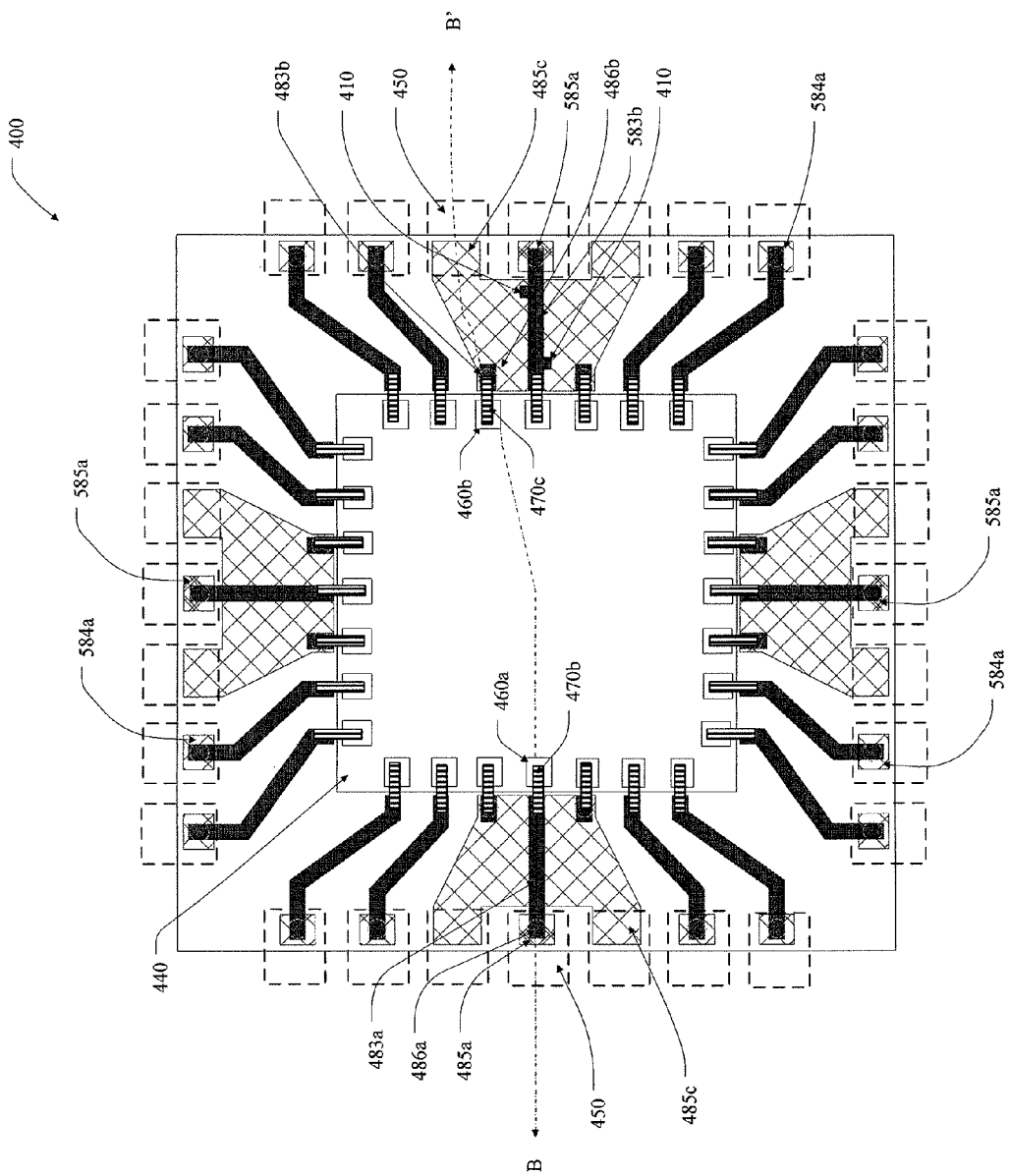
FIG. 5 is a diagrammatic top plan view depicting the exemplary chip assembly illustrated in FIG. 4.

To make a microelectronic chip assembly useful at frequencies greater than 10 GHz, matching elements (e.g., tabs 410 shown in FIG. 5) can be placed on a conductive trace (e.g., a transmission line 583b in FIG. 5). The conductive trace 583b may be utilized for a high frequency signal. The matching elements can cancel out the impedance discontinuities created by the bond wires and the lands. The exact nature and design of the matching element depend on the physical dimensions and separations of the lands and bond-wire lengths, and the thickness of the chip and the frequency extending device. Once these parameters are given the matching elements can be readily designed and verified by, for example, dynamic three-dimensional electro-magnetic field simulations. Matching elements may consist of short series transmission line segments that are either higher or lower in impedance than the characteristic impedance (typically 50 ohms) and open or short shunt stubs.

In addition to providing the space for matching elements which can allow the assembly to operate with a bandwidth of tens of GHz, a frequency extending device can also serve as a substrate for other discrete components such as power line by-pass capacitors and resistor-capacitor (R-C) low pass filters for phase lock loops (PLLs), both of which should ideally be close to the chip.

In FIG. 1, the bond wire (e.g., 170a, 170d) connecting the frequency extending device 180 to the land 150 is longer than the bond wire (e.g., 170b, 170c) connecting the contact (e.g., 160a, 160b) of the chip 140 to the frequency extending device 180 because the bond wire to the land (e.g., 170a, 170d) is down-bonded. Accordingly, this longer bond wire (e.g., 170a, 170d) constitutes the main discontinuity that limits the operating bandwidth.

Figure 4:
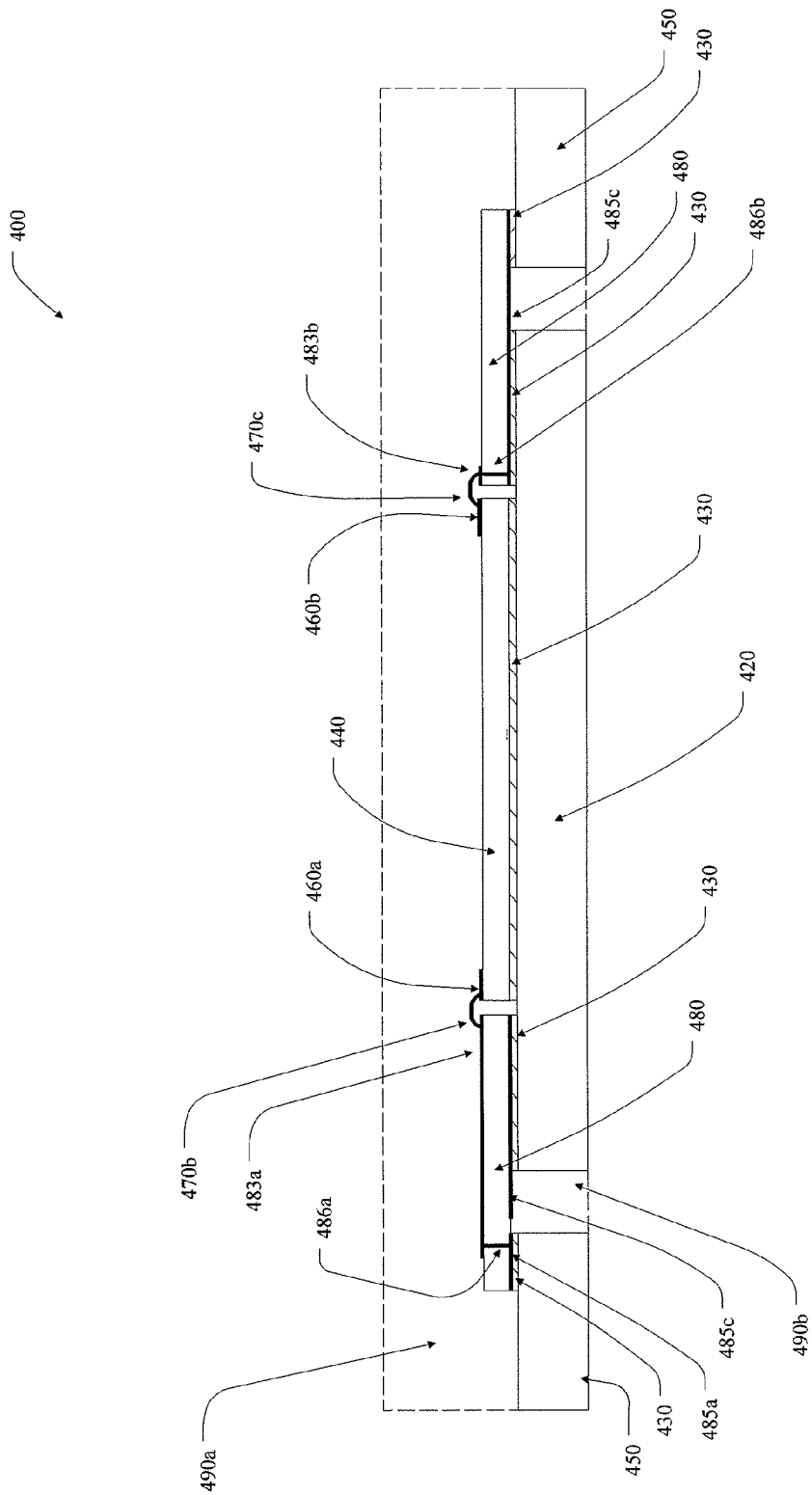
FIG. 4 is a diagrammatic cross-sectional view depicting yet another exemplary chip assembly.

In the exemplary configuration shown in FIGS. 4 and 5, the bond wires (e.g., 170a, 170d of FIG. 1) connecting the traces on a frequency extending device to the lands are eliminated. A microelectronic chip assembly 400 includes a chip 440 and a frequency extending device 480. The microelectronic chip assembly 400 may further include an interface layer 430 and a lead frame. The lead frame may include a paddle 420 disposed in the center region of the lead frame and lands 450 disposed in the peripheral region of the lead frame surrounding the paddle 420. The contacts 460a and 460b on the chip 440 are connected to the conductive traces 483a (a signal trace) and 483b (e.g., a ground trace) on the frequency extending device 480 using bond wires 470b and 470c.

The frequency extending device 480 overhangs the lands 450, and the conductive traces on the bottom layer of the frequency extending device 480 (e.g., high frequency signal traces 485a and 585a, low frequency signal traces 584a, and ground traces 485c) are connected to the lands 450 without using bond wires. These conductive traces may be, for example, solder-reflowed or conductive-epoxied to the lands 450. The interface layer 430 may be a conductive layer that is solder-reflowed or conductive-epoxied. In one aspect, low frequency signals may be, for example, less than or equal to 10 MHz or less than 1 GHz, and high frequency signals may be, for example, greater than 1 GHz, 30-40 GHz, up to 70 GHz.

The conductive path—460a, 470b, 483a, 486a, 485a, 430 and 450—is an exemplary signal path, and the conductive path—460b, 470c, 483b, 486b, 485c, 430, and 450—is an exemplary ground path. In both cases vias, 486a and 486b are used to route the top layer trace to the bottom layer. Matching elements (e.g., tabs 410) may be placed on high frequency signal traces such as conductive traces 483a and 583b. Other discrete components can also be placed on the frequency extending device 480. With the bond wire connecting to the land eliminated, it is possible to match out the remaining discontinuities to a higher bandwidth.

It is also possible to eliminate the bond wires (e.g., 470b, 470c) connecting the contacts on a chip to the traces on a frequency extending device. This is illustrated with reference to FIGS. 6-9. Like the microelectronic chip assembly 100 in FIG. 1, each of the microelectronic chip assemblies 600, 700 and 900 in FIGS. 6-9 includes a chip 640, 740 and 940, respectively, and a frequency extending device 680, 780 and 980, respectively. A microelectronic chip assembly (e.g., 600, 700 or 900) may be a package with a boundary, and the package may be filled (or encapsulated) with non-conductive, resilient materials. In one aspect, the package does not have any leads extending beyond the boundary of the package.

Each of the microelectronic chip assemblies 600, 700 and 900 may further include an interface layer 630, 730 and 930, respectively, and a lead frame. Each of the lead frames may include a paddle 620, 720 and 920, respectively, disposed in the center region of the respective lead frame and lands 650, 750 and 950, respectively, disposed in the peripheral region of the respective lead frame surrounding the paddle 620, 720 and 920, respectively.

Each of the lands and the paddles may be completely conductive or may include conductive and non-conductive regions. In another aspect, each of the paddles may be non-conductive. In one aspect, an interface layer is conductive (e.g., an interface layer between a chip and a paddle is conductive, an interface layer between a frequency extending device and a paddle is conductive, and an interface layer between a frequency extending device and a land is conductive). In another aspect, an interface layer may be non-conductive (e.g., an interface layer between a chip and a paddle may be non-conductive, and an interface layer between a frequency extending device and a paddle may be non-conductive). If an interface layer is used to electrically connect one conductive trace or layer to another conductive trace or layer, then a conductive interface layer may be used. For example, an interface layer 630 between 685a and 650, an interface layer 630 between 685b and 650, an interface layer 730 between 785a and 750, an interface layer 730 between 785b and 750, an interface layer 930 between 985a and 950, and an interface layer 930 between 985b and 950 can be conductive.

Each of the frequency extending devices 680, 780, and 980 may include (i) an upper front surface 692a, 792a, and 992a, respectively, (ii) a lower front surface 692b, 792b, and 992b, respectively, (iii) a rear surface 692c, 792c, and 992c, respectively, and (iv) sides 692d and 692e, 792d and 792e, and 992d and 992e, respectively.

The upper front surface (e.g., 692a, 792a, or 992a, respectively) of the frequency extending device 680, 780, or 980, respectively, may face away from the front surface of the chip 640, 740, or 940, respectively. The lower front surface (e.g., 692b, 792b, or 992b, respectively) of the frequency extending device 680, 780, or 980, respectively, may face toward the front surface of the chip 640, 740, or 940, respectively.

At least one side (e.g., 692d, 792d, or 992d, respectively) of the frequency extending device 680, 780, or 980, respectively, may face toward the side of the chip 640, 740, or 940, respectively. At least another side (e.g., 692e, 792e, or 992e, respectively) of the frequency extending device 680, 780, or 980, respectively, may face away from the side of the chip 640, 740, or 940, respectively. The rear surface (e.g., 692c, 792c, or 992c, respectively) of the frequency extending device 680, 780, or 980, respectively, may face toward the paddle 620, 730 and 930, respectively.

Figure 6:
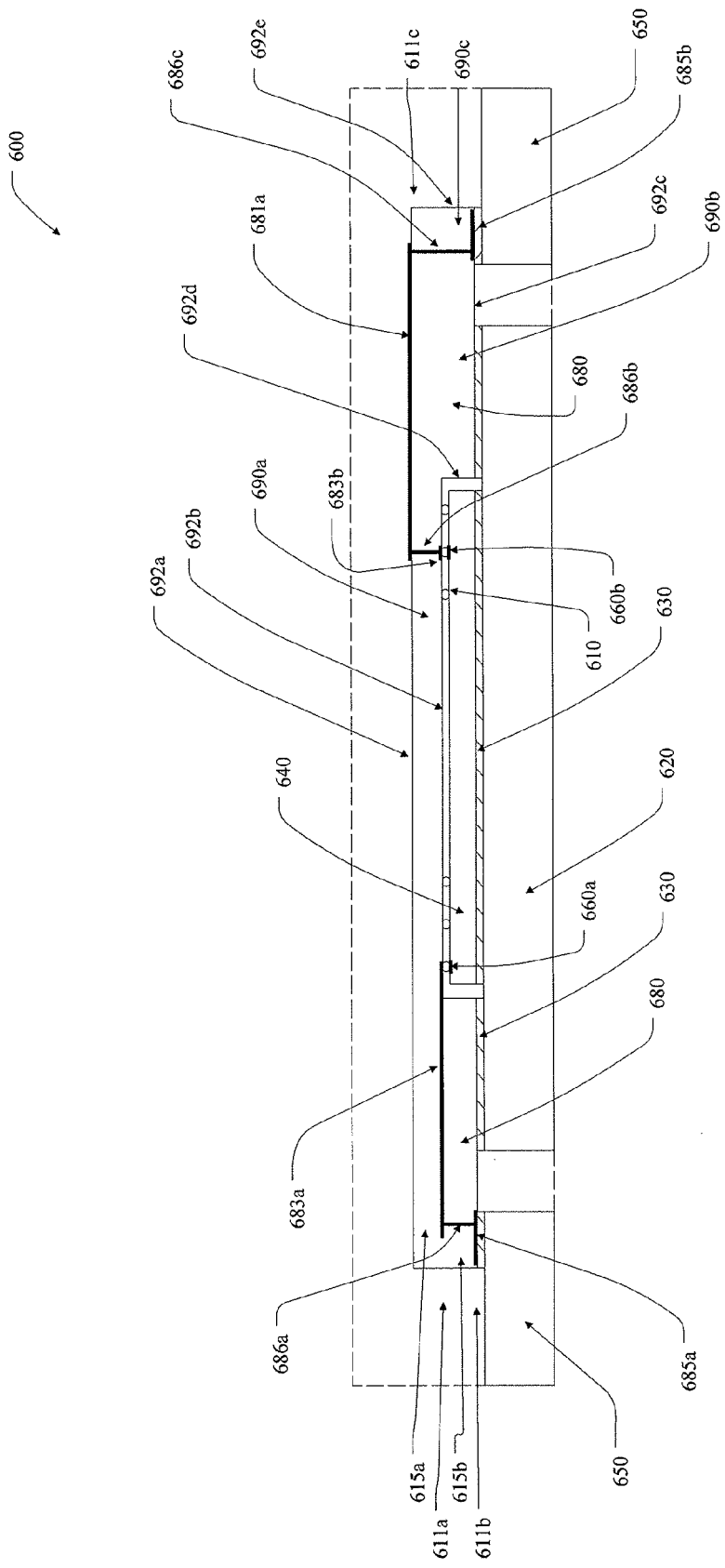
FIG. 6 is a diagrammatic cross-sectional view depicting yet another exemplary chip assembly.

Each of the frequency extending devices 680, 780, and 980 may include one or more conductive layers. FIG. 6 shows three exemplary conductive layers, FIG. 7 shows two exemplary conductive layers, and FIG. 9 shows three exemplary conductive layers.

A first conductive layer (e.g., 611a, 711a, or 911a) of a frequency extending device (e.g., 680, 780, or 980) may include one or more conductive traces (e.g., conductive traces 683a and 683b, 783a and 783c, or 983a and 983b, respectively). A second conductive layer (e.g., 611b, 711b, or 911b) of a frequency extending device (e.g., 680, 780, or 980) may include one or more conductive traces (e.g., conductive traces 685a and 685b, 785a and 785b, or 985a, 985b and 985c, respectively). A third conductive layer (e.g., 611c or 911c) of a frequency extending device (e.g., 680 or 980) may include one or more conductive traces (e.g., conductive trace 681a or 981a, respectively).

Figure 7:
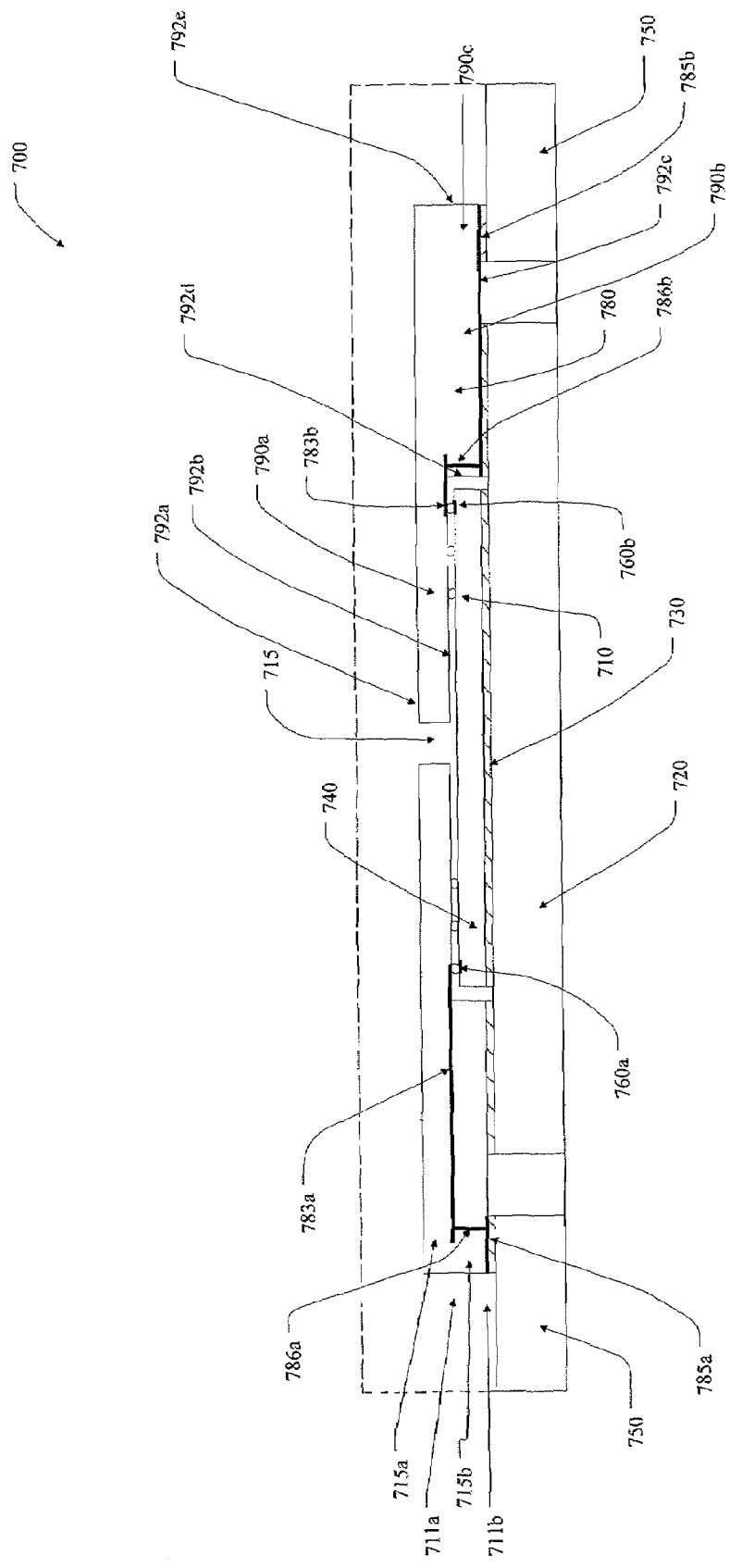
FIG. 7 is a diagrammatic cross-sectional view depicting yet another exemplary chip assembly shown along C-C' of FIG. 8.
Figure 9:
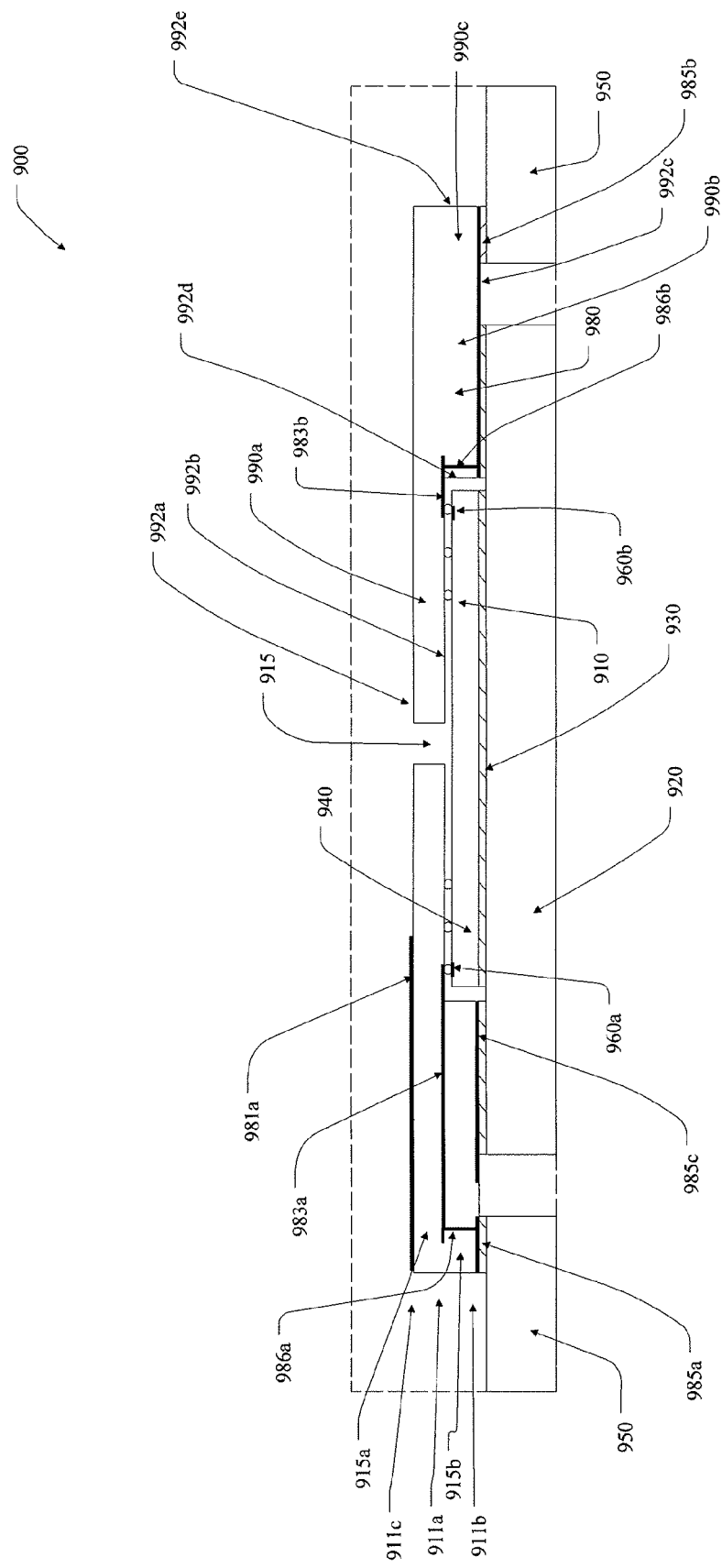
FIG. 9 is a diagrammatic cross-sectional view depicting yet another exemplary chip assembly.

A frequency extending device (e.g., 680, 780, or 980) may further include one or more conductive vias between the first and second conductive layers (e.g., a via 686a connecting the conductive trace 683a to the conductive trace 685a as shown in FIG. 6, a via 786a connecting the conductive trace 783a to the conductive trace 785a and a via 786b connecting the conductive trace 783b to the conductive trace 785b as shown in FIG. 7, and a via 986a connecting the conductive trace 983a to the conductive trace 985a and a via 986b connecting the conductive trace 983b to the conductive trace 985b as shown in FIG. 9).

A frequency extending device (e.g., 680) may further include one or more conductive vias between the second and third conductive layers (e.g., a via 686c connecting the conductive trace 681a to the conductive trace 685b) and between the first and third conductive layers (e.g., a via 686b connecting the conductive trace (or a contact pad) 683b to the conductive trace 681a).

At least a portion of one of the one or more conductive traces of the first conductive layer may be disposed on the lower front surface of a frequency extending device. At least a portion of one of the one or more conductive traces of the second conductive layer of the frequency extending device may be disposed on the rear surface of a frequency extending device. At least a portion of one of the one or more conductive traces of the third conductive layer may be disposed on the upper front surface of a frequency extending device.

A frequency extending device (e.g., 680, 780, or 980) may have a first overhang portion (e.g., 690a, 790a, or 990a, respectively) disposed at least partially or completely overlying the chip (e.g., 640, 740, or 940, respectively). A frequency extending device (e.g., 680, 780, or 980) may have a base portion (e.g., 690b, 790b, or 990b, respectively) disposed at least partially or completely overlying the paddle (e.g., 620, 720, or 920, respectively). A frequency extending device (e.g., 680, 780, or 980) may have a second overhang portion (e.g., 690c, 790c, or 990c, respectively) disposed at least partially overlying the lands (e.g., 650, 750, or 950, respectively).

In one aspect, a frequency extending device 680, 780, or 980 may completely surround the sides of the respective chip 640, 740, or 940 and at least partially surround the front surface of the respective chip. In another aspect, a frequency extending device (e.g., 680) may completely surround the sides as well as the front surface of a chip (e.g., 640).

In one aspect, a chip (e.g., 640, 740, or 940) may be at least partially encapsulated by a frequency extending device and by a paddle. In another aspect, a paddle (e.g., 620) may completely surround the rear surface of a chip (e.g., 640). Accordingly, a chip (e.g., 640) may be completely encapsulated by a frequency extending device (e.g., 680) and by a paddle (e.g., 620).

A frequency extending device 680, 780, or 980 may have one or more outer surfaces and one or more inner surfaces. The one or more outer surfaces may, for example, include one or more upper outer surfaces and one or more lower outer surfaces. A first upper outer surface may include one or more conductive traces (e.g., at least portions of 681a and 981a). A second upper outer surface may include one or more conductive traces (e.g., at least portions of 683a, 683b, 783a, 783b, 983a, and 983b). Lower outer surfaces may also include one or more conductive traces (e.g., at least portions of 685a, 685b, 785a, 785b, 985a, 985b, and 985c). Inner surfaces may also include one or more conductive traces (e.g., at least portions of 683a, 783a, 783b, 983a, and 983b).

Each of the microelectronic chip assemblies 600, 700 and 900 may further include solder balls 610, 710, and 910. In one aspect, the height of the solder balls may define the gap between the front surface of a chip and the lower front surface of a frequency extending device. The solder balls may connect the conductive contacts (e.g., 660a and 660b, 760a and 760b, or 960a and 960b) of the respective chip 640, 740, or 940 to conductive traces (e.g., 683a and 683b, 783a and 783b, or 983a and 983b) of the respective frequency extending device 680, 780, or 980.

In FIGS. 6-9, no bond wires are used according to one aspect of the disclosure. The flip-chip configurations shown in FIGS. 6-9 utilize solder balls and other interface layers (see, e.g., interfaces 630, 730 and 930). In one aspect, solder balls maybe bondable materials. They may be generally in a ball shape or in another shape. Solder balls may include one or more materials and one or more layers.

In FIG. 6, a contact 660a of a chip 640 is connected to a land 650 via a solder ball 610, a conductive trace 683a, a via 686a, a conductive trace 685a, and a conductive interface layer 630. In one aspect, this conductive path may be utilized by a low frequency signal. A contact 660b of the chip 640 is connected to a land 650 via a solder ball 610, a conductive trace 683b, a via 686b, a conductive trace 681a, a via 686c, a conductive trace 685b, and a conductive interface layer 630. In one aspect, this conductive path may be utilized by a low frequency signal. The chip 640 and the frequency extending device 680 may be attached to a paddle 620 using an interface layer 630, which may be conductive. In another aspect, the interface layer 630 may be non-conductive. In one aspect, the paddle 620 is used for ground. In other aspects of the disclosure, the conductive paths shown in FIG. 6 may be utilized for other types of signals, power supplies, or ground.

Figure 8:
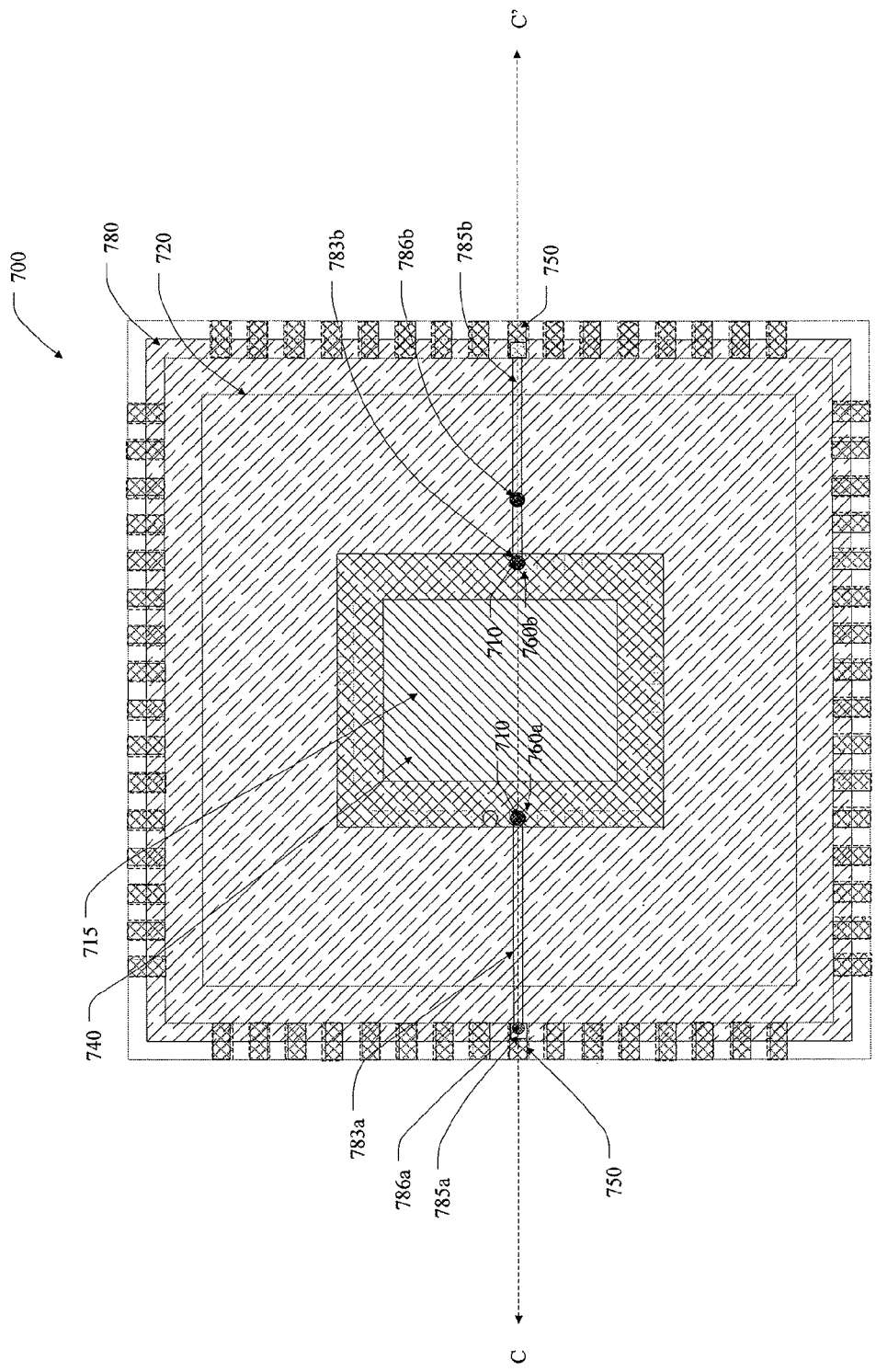
FIG. 8 is a diagrammatic top plan view depicting the exemplary chip assembly illustrated in FIG. 7.

In FIGS. 7 and 8, a contact 760a of a chip 740 is connected to a land 750 via a solder ball 710, a conductive trace 783a (which can be, for example, the signal path of a dielectric-covered microstrip), a via 786a, a conductive trace 785a, and a conductive interface layer 730. In one aspect, this conductive path may be utilized by a low frequency or high frequency signal. A contact 760b of the chip 740 is connected to a land 750 via a solder ball 710, a conductive trace 783b (which can be, for example, the ground plane for the above dielectric-covered microstrip), a via 786b, a conductive trace 785b, and a conductive interface layer 730. In one aspect, this conductive path may be utilized for ground. The chip 740 and the frequency extending device 780 may be attached to a paddle 720 using an interface layer 730, which may be conductive. In another aspect, the interface layer 730 may be non-conductive. The conductive trace 785b may be mechanically and/or electrically connected to the paddle 720 using, for example, the interface layer 730. If the interface layer 730 is conductive, then the conductive trace 785b may be electrically connected to the paddle 720. In one aspect, the paddle 720 is used for ground. The frequency extending device 780 includes a gap 715 in the first overhang portion 790a so that the frequency extending device 780 only partially surrounds the front surface of the chip 740. In other aspects of the disclosure, the conductive paths shown in FIG. 7 may be utilized for other types of signals, power supplies, or ground.

While FIG. 8 illustrates contacts (e.g., 760a and 760b) in the periphery of the chip 740, contacts may be populated anywhere on the front surface of the chip 740 (e.g., the inner areas as well as the periphery of the chip 740). Typically, high frequency signals and their accompanying grounds may be routed with the contacts and solder balls located in the periphery of the chip 740. Contacts and solder balls located in the inner areas of the chip 740 may be typically utilized for low frequency signals and power supplies. These signals can be routed to their respective lands using vias and conductive traces. Similar arrangements can be made with respect to the configurations shown in FIGS. 6 and 9 and other figures.

In FIG. 9, a contact 960a of a chip 940 is connected to a land 950 via a solder ball 910, a conductive trace 983a, a via 986a, a conductive trace 985a, and a conductive interface layer 930. The conductive trace 983a is disposed between the conductive trace 981a and the conductive trace 985c. In one aspect, a conductive path formed between the contact 960a and the land 950 may be utilized by a high frequency signal. In this case, both 981a and 985c can be similarly shaped as 485c in FIG. 5 and serve as top and bottom ground planes for high frequency signal path 983a in a stripline configuration. Both 981a and 985c can be connected to their respective ground pads on the chip by vias and solder balls at the chip end and by vias and 930 layer to their respective ground lands on the land end. These ground lands are typically on both sides of the corresponding signal land as shown in FIG. 5 in a ground-signal-ground configuration. Typically, vias are also used to connect ground planes 981a and 985c together electrically. In another aspect, the paths 981a and 983a may be utilized by, for example, a low frequency signal or power.

A contact 960b of the chip 940 is connected to a land 950 via a solder ball 910, a conductive trace 983b, a via 986b, a conductive trace 985b, and a conductive interface layer 930. In one aspect, this path may be utilized for ground. In another aspect, this path may be utilized as a signal line or a power line (provided that if the paddle 920 is used for ground, the conductive trace 985b is not electrically connected to the paddle 920). The chip 940 and the frequency extending device 980 may be attached to the paddle 920 using an interface layer 930, which may be conductive or non-conductive. In one aspect, the paddle 920 is used for ground. The frequency extending device 980 includes a gap 915 in the first overhang portion 990a so that the frequency extending device 980 only partially surrounds the front surface of the chip 940.

As illustrated in FIGS. 6-9, a chip may use a flip-chip configuration where solder balls (e.g., C4 balls) may be used instead of bond wires. Although a typical flip-chip configuration may reduce the inductance (good electrically), its main disadvantage is that greater effort is required to remove heat from the rear surface of a chip. A typical flip-chip configuration may thus require a heat sink attached to the rear surface of a chip. This increases the mechanical complexity of the assembly because the rear surface of the chip is normally facing up.

In the wire-bond configurations such as those illustrated in FIGS. 1-5, heat may be easily removed because the rear surface of a chip can be attached (e.g., epoxied) to a conductive paddle (which has a high thermal conductivity). In assemblies utilizing a flip-chip configuration as illustrated in FIGS. 6-9, the rear side of the chip is still facing down as in FIGS. 1-5. This arrangement provides not only good electrical properties (having low inductance) but also good thermal conductance (due to easy removal of heat). As shown in FIGS. 6-9, heat can be easily removed by simply attaching the rear surface of a chip to a paddle (having a high thermal conductivity) without requiring a separate heat sink or a complex mechanical assembly on top of the PCB for extracting heat. Typical heat sinking is done either using metal traces on the board connected to the paddle as radiators or part of the metal housing connected through thermal vias in the PCB to the paddle. Accordingly, the exemplary microelectronic chip assemblies shown in FIGS. 6-9 not only reduce inductance for higher frequency applications but also facilitate easy removal of heat from a chip.

As illustrated in FIGS. 6-9, a frequency extending device can be in the shape of an inverted tub. A frequency extending device has one or more dielectric layers and one or more conductive layers (e.g., two dielectric layers and three metal layers; one dielectric layer and one metal layer; two dielectric layers and two metal layers; or other configurations). Exemplary dielectric layers include dielectric layers 615a and 615b, 715a and 715b, or 915a and 915b. A gap (e.g., 715 and 915), which can be an access hole, may be made in the middle of the bottom of the tub for introducing underfill material (UF) for the solder balls. A chip (e.g., 640, 740, or 940) can be first reflow-soldered to the middle metal layer (e.g., a first conductive layer 611a, 711a or 911a) of a frequency extending device inside the tube. The interface/chip sub-assembly can then be reflow-soldered to the lands (e.g., 650, 750, or 950) and the paddle (e.g., 620, 720, or 920).

Figure 10:
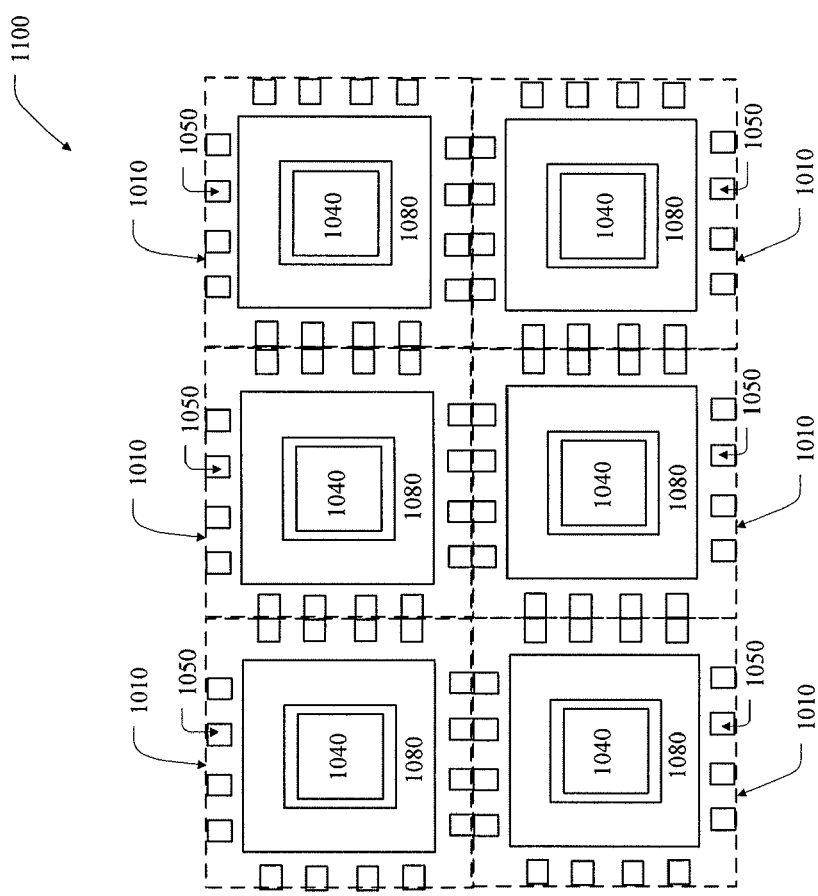
FIG. 10 is a diagrammatic top plan view depicting an array of exemplary chip assemblies.

FIG. 10 is a diagrammatic top plan view depicting an array of exemplary chip assemblies. To manufacture an array of microelectronic chip assemblies (such as those illustrated in FIGS. 1, 2, and 4-9), one may start with an array of metal lead frames 1010, each of which may include a paddle and lands 1050 around the paddle. A lead frame may be a generic, standard, commercially available, non-customized, off-the-shelf, inexpensive unit. A chip 1040 may be mounted on its respective paddle with an interface layer (e.g., solder or conductive epoxy). The contacts on each chip may be connected to the respective lands by utilizing a frequency extending device 1080. The contacts on a chip may be connected to the conductive traces on a frequency extending device utilizing, for example, bond wires or solder balls. The conductive traces on a frequency extending device may be connected to the lands utilizing, for example, bond wires or interface layers. The array of microelectronic chip assemblies may then be potted with plastic encapsulation and be subsequently singulated by sawing into individual microelectronic chip assemblies. The dashed lines in FIG. 10 show the boundary of each microelectronic chip assembly, which is a singulated package having plastic encapsulation.

In accordance with one aspect of the disclosure, FIG. 11 illustrates an exemplary method of manufacturing microelectronic chip assemblies. The method may include some or all of the steps described below. Some of the steps may be performed simultaneously, and some of the steps may be performed in an order different from the order described below. At step 1110, a plurality of metal lead frames formed in a fixed-attached array may be provided. These metal lead frames are attached to one another and form a fixed array.

Each of the metal lead frames may have a paddle in a center region and a plurality of conductive lands in a peripheral region. The plurality of conductive lands may surround the paddle, and the plurality of conductive lands may be discretely defined and arranged inwardly toward the paddle.

At step 1120, a plurality of chips may be attached to the plurality of metal lead frames. This is performed by, for example, attaching each of the plurality of chips to a corresponding one of the paddles. Each of the plurality of chips may have a front surface, a rear surface, and a side. Each of the plurality of chips may overly the corresponding one of the paddles. Each of the plurality of chips may have conductive contacts on its front surface.

At step 1130, a plurality of frequency extending devices may be attached to the plurality of metal lead frames. Each of the plurality of frequency extending devices may be disposed at least partially adjacent to the side of a corresponding one of the plurality of chips and at least partially overlying a corresponding one of the paddles. Each of the plurality of frequency extending devices may have at least a first conductive layer and a first dielectric layer. The first conductive layer may have one or more conductive traces.

Each of the plurality of frequency extending devices may be configured to provide a lower discontinuity in impedance as compared to one or more bond wires. In one aspect, each of the plurality of frequency extending devices may be configured to provide a lower discontinuity in impedance as compared to the impedance discontinuity that would be produced by one or more bond wires if the one or more bond wires were to be used in place of each of the plurality of the frequency extending devices (including the associated connection to its respective chip and lands). In another aspect, each of the plurality of frequency extending devices is configured to reduce impedance discontinuity such that the impedance discontinuity produced by the corresponding frequency extending device is less than an impedance discontinuity that would be produced by one or more bond wires each having a length greater than, equal to, or substantially equal to the distance between a conductive contact of a corresponding chip and a corresponding conductive land.

At least one of the conductive contacts of each of the plurality of chips may be connected to at least one of the one or more conductive traces of a corresponding one of the plurality of frequency extending devices. Furthermore, at least one of the one or more conductive traces of each of the plurality of frequency extending devices may be connected to at least one of the plurality of conductive lands of a corresponding one of the plurality of metal lead frames.

At step 1140, the microelectronic chip assemblies are encapsulated. Each of the microelectronic chip assemblies has a corresponding one of the plurality of metal lead frames, a corresponding one of the plurality of chips, and a corresponding one of the plurality of frequency extending devices. At step 1150, the microelectronic chip assemblies are separated from the fixed-attached array into individual packages. A microelectronic chip assembly may be, for example, 4 mm to 19 mm per side, and may have a thickness of about 1 mm to 5 mm. These dimensions are exemplary, and the subject technology is not limited to these dimensions.

In step 1120, each of the plurality of chips may be attached to a corresponding one of the paddles by forming a conductive interface layer between each of the plurality of chips and a corresponding one of the paddles. In step 1130, each of the plurality of frequency extending devices may be disposed by forming an interface layer between each of the plurality of the frequency extending devices and a corresponding one of the paddles. In one aspect, the interface layer is conductive.

According to one aspect of the disclosure, at least one of the conductive contacts of each of the plurality of chips may be connected to at least one of the one or more conductive traces of a corresponding one of the plurality of frequency extending devices by having one or more solder balls between the conductive contacts of each of the plurality of chips and the one or more conductive traces of a corresponding one of the plurality of frequency extending devices. According to another aspect, one or more bond wires may be utilized in place of the one or more solder balls.

According to one aspect of the disclosure, at least one of the one or more conductive traces of each of the plurality of frequency extending devices may be connected to at least one of the plurality of conductive lands of a corresponding one of the plurality of metal lead frames by forming a conductive interface layer between each of the plurality of the frequency extending devices and a corresponding plurality of conductive lands. In one aspect, such interface layer is not a bond wire. According to another aspect, a bond wire may be utilized in place of the conductive interface layer.

Each of the plurality of frequency extending devices may be surface mounted on a corresponding paddle and on a corresponding plurality of conductive lands. Each of the steps of providing a plurality of metal lead frames, attaching a plurality of chips, attaching a plurality of frequency extending devices, encapsulating the microelectronic chip assemblies, and separating the microelectronic chip assemblies may be performed automatically using a tool without human intervention.

According to one aspect, the steps of (i) disposing each of the plurality of frequency extending devices at least partially adjacent to the side of a corresponding one of the plurality of chips and at least partially overlying a corresponding one of the paddles and (ii) connecting at least one of the one or more conductive traces of each of the plurality of frequency extending devices to at least one of the plurality of conductive lands of a corresponding one of the plurality of metal lead frames are performed simultaneously.

It should be noted that in one aspect of the disclosure, the description provided herein with reference to FIGS. 1 and 2 (except for the description about the bond wires) may be applicable to other figures such as FIGS. 4-9, and vice versa.

Those of skill in the art would appreciate that the functionality described herein may be implemented in varying ways. Various components and blocks may be arranged differently (e.g., arranged in a different order, or partitioned in a different way) all without departing from the scope of the subject technology.

It is understood that the specific order or hierarchy of steps in the processes disclosed is an illustration of exemplary approaches. Based upon design preferences, it is understood that the specific order or hierarchy of steps in the processes may be rearranged. The accompanying method claims present elements of the various steps in a sample order, and are not meant to be limited to the specific order or hierarchy presented. Some of the steps may be performed simultaneously.

Terms such as "front," "rear," "side," "top," "bottom," "horizontal," "vertical," "above," "below," "beneath," and the like as used in this disclosure should be understood as referring to an arbitrary frame of reference, rather than to the ordinary gravitational frame of reference. Thus, a front surface and a rear surface may extend upwardly, downwardly, diagonally, or horizontally in a gravitational frame of reference. The term such as "overlie" and the like may refer to being above or being below. Terms such as "have," "include," and the like are an open ended term and are used in a manner similar to "comprise." Terms such as "connect," "couple," and the like may refer to direct or indirect connection, or direct or indirect coupling.

It should be noted that according to one aspect, a conductive trace can be a lead, a pad, a terminal, a block, or the like. Conductive traces may be made of one or more metal materials or other conductive materials. A side may be one or more sides or all sides of a given part. While certain conductive paths and patterns are disclosed herein, the subject technology is not limited to these paths and patterns and can be applied to other paths and patterns. While a small number of contacts and lands are disclosed herein for illustration purposes, a large number of contacts and lands may be also utilized. In addition, multiple rows of contacts, an array of contacts and/or multiple rows of lands may be utilized. A front surface may be an outer surface or an inner surface. A rear surface may be an outer surface or an inner surface. An outer surface may have one or more layers such as protective layers over the outer surface.

The subject technology may be applied to various generic, standard, off-the-shelf, commercially available, inexpensive packages such as quad flat no lead (QFN) packages, chip scale packages (CSPs), small-outline integrated circuit (SOIC) packages, small outline (SO) packages, small outline transistor (SOT) packages, T0220, dual-in-line (DIP) packages. These are exemplary packages, and the subject technology is not limited to these.

In one aspect, microelectronic chip assemblies of the subject technology do not require connectors such as coaxial connectors (e.g., GPPO connectors). The microelectronic chip assemblies may be manufactured using automatic assembly equipment. Generic, standard, commercially available substrates/lands/frames can be utilized to package custom chips. The subject technology can be applied to wire-bond configurations, flip-chip configurations, and a combination of both.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. A method of manufacturing chip assemblies, comprising:
    providing a plurality of metal lead frames formed in a fixed-attached array, each of the plurality of metal lead frames having a paddle in a center region and a plurality of conductive lands in a peripheral region, the plurality of conductive lands surrounding the paddle, the plurality of conductive lands discretely defined and arranged inwardly toward the paddle;
    attaching a plurality of chips to the plurality of metal lead frames, the step of attaching a plurality of chips comprising:
        attaching each of the plurality of chips to a corresponding one of the paddles, each of the plurality of chips having a front surface, a rear surface and a side, each of the plurality of chips overlying the corresponding one of the paddles, each of the plurality of chips having conductive contacts on its front surface, wherein the front surface of each of the plurality of chips faces away from the corresponding one of the paddles;
    attaching a plurality of frequency extending devices to the plurality of metal lead frames, the step of attaching a plurality of frequency extending devices comprising:
        disposing each of the plurality of frequency extending devices at least partially adjacent to the side of a corresponding one of the plurality of chips and at least partially overlying a corresponding one of the paddles, each of the plurality of frequency extending devices having at least a first conductive layer and a first dielectric layer, the first conductive layer having one or more conductive traces, each of the plurality of frequency extending devices configured to provide a lower discontinuity in impedance as compared to one or more bond wires;
        connecting at least one of the conductive contacts of each of the plurality of chips to at least one of the one or more conductive traces of a corresponding one of the plurality of frequency extending devices; and
        connecting at least one of the one or more conductive traces of each of the plurality of frequency extending devices to at least one of the plurality of conductive lands of a corresponding one of the plurality of metal lead frames;
    encapsulating the chip assemblies, each of the chip assemblies having a corresponding one of the plurality of metal lead frames, a corresponding one of the plurality of chips, and a corresponding one of the plurality of frequency extending devices; and
    separating the chip assemblies from the fixed-attached array into individual packages,
    wherein each of the plurality of frequency extending devices is surface mounted on a corresponding paddle and on a corresponding plurality of conductive lands, and
    wherein the step of connecting at least one of the conductive contacts comprises having one or more solder balls between the conductive contacts of each of the plurality of chips and the one or more conductive traces of a corresponding one of the pluralilty of frequency extending devices.

2. The method according to claim 1, wherein the step of attaching each of the plurality of chips comprises forming a conductive interface layer between each of the plurality of chips and a corresponding one of the paddles,
    wherein the step of disposing each of the plurality of frequency extending devices comprises forming an interface layer between each of the plurality of the frequency extending devices and a corresponding one of the paddles, and
    wherein the step of connecting at least one of the one or more conductive traces comprises forming a conductive interface layer between each of the plurality of the frequency extending devices and a corresponding plurality of conductive lands.

3. The method according to claim 2, wherein the interface layer is conductive.

4. The method according to claim 1, wherein each of the plurality of frequency extending devices completely surrounds a corresponding one of the plurality of chips.

5. The method according to claim 1, wherein each of the plurality of frequency extending devices partially surrounds a corresponding one of the plurality of chips.

6. The method according to claim 1, wherein the step of attaching each of the plurality of chips comprises forming a conductive interface layer between each of the plurality of chips and a corresponding one of the paddles, and
wherein the step of disposing each of the plurality of frequency extending devices comprises forming a conductive interface layer between each of the plurality of the frequency extending devices and a corresponding one of the paddles.

7. The method according to claim 1, wherein the step of disposing each of the plurality of frequency extending devices and the step of connecting at least one of the one or more conductive traces are performed simultaneously for each of the plurality of frequency extending devices.

8. The method according to claim 1, wherein each of the steps of providing a plurality of metal lead frames, attaching a plurality of chips, attaching a plurality of frequency extending devices, encapsulating the chip assemblies, and separating the chip assemblies is performed automatically.

9. The method according to claim 1, wherein the paddle and the plurality of conductive lands in each of the plurality of metal lead frames are of the same material and are of the same thickness.

10. The method according to claim 1, wherein the paddle is conductive.

11. A method of manufacturing chip assemblies, comprising:
providing a plurality of metal lead frames formed in a fixed-attached array, each of the plurality of metal lead frames having a paddle in a center region and a plurality of conductive lands in a peripheral region, the plurality of conductive lands surrounding the paddle, the plurality of conductive lands discretely defined and arranged inwardly toward the paddle;
attaching a plurality of chips to the plurality of metal lead frames, the step of attaching a plurality of chips comprising:
attaching each of the plurality of chips to a corresponding one of the paddles, each of the plurality of chips having a front surface, a rear surface and a side, each of the plurality of chips overlying the corresponding one of the paddles, each of the plurality of chips having conductive contacts on its front surface;
attaching a plurality of frequency extending devices to the plurality of metal lead frames, the step of attaching a plurality of frequency extending devices comprising:
disposing each of the plurality of frequency extending devices at least partially adjacent to the side of a corresponding one of the plurality of chips and at least partially overlying a corresponding one of the paddles, each of the plurality of frequency extending devices having at least a first conductive layer and a first dielectric layer, the first conductive layer having one or more conductive traces, each of the plurality of frequency extending devices configured to provide a lower discontinuity in impedance as compared to one or more bond wires;
connecting at least one of the conductive contacts of each of the plurality of chips to at least one of the one or more conductive traces of a corresponding one of the plurality of frequency extending devices; and
connecting at least one of the one or more conductive traces of each of the plurality of frequency extending devices to at least one of the plurality of conductive lands of a corresponding one of the plurality of metal lead frames;
encapsulating the chip assemblies, each of the chip assemblies having a corresponding one of the plurality of metal lead frames, a corresponding one of the plurality of chips, and a corresponding one of the plurality of frequency extending devices; and
separating the chip assemblies from the fixed-attached array into individual packages,
wherein the paddle and the plurality of conductive lands in each of the plurality of metal lead frames are of the same material and are of the same thickness, and
wherein the step of connecting at least one of the conductive contacts comprises having one or more solder balls between the conductive contacts of each of the plurality of chips and the one or more conductive traces of a corresponding one of the plurality of frequency extending devices.

12. The method according to claim 11, wherein each of the plurality of frequency extending devices is surface mounted on a corresponding paddle and on a corresponding plurality of conductive lands.

13. The method according to claim 11, wherein the step of attaching each of the plurality of chips comprises forming a conductive interface layer between each of the plurality of chips and a corresponding one of the paddles,
wherein the step of disposing each of the plurality of frequency extending devices comprises forming an interface layer between each of the plurality of the frequency extending devices and a corresponding one of the paddles, and
wherein the step of connecting at least one of the one or more conductive traces comprises forming a conductive interface layer between each of the plurality of the frequency extending devices and a corresponding plurality of conductive lands.

14. The method according to claim 13, wherein the interface layer is conductive.

15. The method according to claim 11, wherein the step of attaching each of the plurality of chips comprises forming a conductive interface layer between each of the plurality of chips and a corresponding one of the paddles, and
wherein the step of disposing each of the plurality of frequency extending devices comprises forming a conductive interface layer between each of the plurality of the frequency extending devices and a corresponding one of the paddles.

16. The method according to claim 11, wherein the step of disposing each of the plurality of frequency extending devices and the step of connecting at least one of the one or more conductive traces are performed simultaneously for each of the plurality of frequency extending devices.

17. The method according to claim 11, wherein the paddle is conductive.

18. A method of manufacturing chip assemblies, comprising:
- providing a plurality of metal lead frames formed in a fixed-attached array, each of the plurality of metal lead frames having a paddle in a center region and a plurality of conductive lands in a peripheral region, the plurality of conductive lands surrounding the paddle, the plurality of conductive lands discretely defined and arranged inwardly toward the paddle, wherein a top surface of the paddle is vertically on the same plane as a top surface of each of the plurality of conductive lands;
- attaching a plurality of chips to the plurality of metal lead frames, the step of attaching a plurality of chips comprising:
  - attaching each of the plurality of chips to a corresponding one of the paddles, each of the plurality of chips having a front surface, a rear surface and a side, each of the plurality of chips overlying the corresponding one of the paddles, each of the plurality of chips having conductive contacts on its front surface;
- attaching a plurality of frequency extending devices to the plurality of metal lead frames, the step of attaching a plurality of frequency extending devices comprising:
  - disposing each of the plurality of frequency extending devices at least partially adjacent to the side of a corresponding one of the plurality of chips and at least partially overlying a corresponding one of the paddles, each of the plurality of frequency extending devices having at least a first conductive layer and a first dielectric layer, the first conductive layer having one or more conductive traces, each of the plurality of frequency extending devices configured to provide a lower discontinuity in impedance as compared to one or more bond wires;
  - connecting at least one of the conductive contacts of each of the plurality of chips to at least one of the one or more conductive traces of a corresponding one of the plurality of frequency extending devices; and
  - connecting at least one of the one or more conductive traces of each of the plurality of frequency extending devices to at least one of the plurality of conductive lands of a corresponding one of the plurality of metal lead frames;
- encapsulating the chip assemblies, each of the chip assemblies having a corresponding one of the plurality of metal lead frames, a corresponding one of the plurality of chips, and a corresponding one of the plurality of frequency extending devices; and
- separating the chip assemblies from the fixed-attached array into individual packages,
- wherein the step of connecting at least one of the conductive contacts comprises having one or more solder balls between the conductive contacts of each of the plurality of chips and the one or more conductive traces of a corresponding one of the pluralilty of frequency extending devices.

19. The method according to claim 18, wherein each of the plurality of frequency extending devices is surface mounted on a corresponding paddle and on a corresponding plurality of conductive lands.

20. The method according to claim 18, wherein the step of attaching each of the plurality of chips comprises forming a conductive interface layer between each of the plurality of chips and a corresponding one of the paddles,
- wherein the step of disposing each of the plurality of frequency extending devices comprises forming an interface layer between each of the plurality of the frequency extending devices and a corresponding one of the paddles, and
- wherein the step of connecting at least one of the one or more conductive traces comprises forming a conductive interface layer between each of the plurality of the frequency extending devices and a corresponding plurality of conductive lands.

21. The method according to claim 20, wherein the interface layer is conductive.

22. The method according to claim 18, wherein the step of attaching each of the plurality of chips comprises forming a conductive interface layer between each of the plurality of chips and a corresponding one of the paddles, and
- wherein the step of disposing each of the plurality of frequency extending devices comprises forming a conductive interface layer between each of the plurality of the frequency extending devices and a corresponding one of the paddles.

23. The method according to claim 18, wherein the step of disposing each of the plurality of frequency extending devices and the step of connecting at least one of the one or more conductive traces are performed simultaneously for each of the plurality of frequency extending devices.

24. The method according to claim 18, wherein the paddle and the plurality of conductive lands in each of the plurality of metal lead frames are of the same material and are of the same thickness.

25. The method according to claim 18, wherein the paddle is conductive.

26. The method according to claim 11, wherein the front surface of each of the plurality of chips faces away from the corresponding one of the paddles.

27. The method according to claim 18, wherein the front surface of each of the plurality of chips faces away from the corresponding one of the paddles.

* * * * *